United States Patent [19]

Page

[11] Patent Number: 5,185,524
[45] Date of Patent: Feb. 9, 1993

[54] CHARGED PARTICLE ENERGY ANALYZERS

[75] Inventor: Simon C. Page, Hadfield, England

[73] Assignee: Kratos Analytical Limited, Manchester, England

[21] Appl. No.: 699,669

[22] Filed: May 14, 1991

[30] Foreign Application Priority Data

May 22, 1990 [GB] United Kingdom ............... 9011380

[51] Int. Cl.$^5$ ............................................. H01J 47/00
[52] U.S. Cl. ..................................... 250/305; 250/310
[58] Field of Search ................................ 250/305, 310

[56] References Cited

U.S. PATENT DOCUMENTS

| | | | |
|---|---|---|---|
| 3,818,228 | 6/1974 | Palmberg | 250/305 |
| 4,584,474 | 4/1986 | Franchy et al. | 250/305 |
| 4,737,639 | 4/1988 | Rusch | 250/305 |
| 4,823,003 | 4/1989 | King et al. | 250/305 |
| 4,864,130 | 9/1989 | Gruen et al. | 250/305 |
| 4,959,544 | 9/1990 | Sukenobu | 250/305 |

FOREIGN PATENT DOCUMENTS

| | | |
|---|---|---|
| 0243060 | 10/1987 | European Pat. Off. |
| 0246841 | 11/1987 | European Pat. Off. |
| 0255981 | 2/1988 | European Pat. Off. |
| 2221082 | 1/1990 | United Kingdom |

OTHER PUBLICATIONS

H. Diamon, "New display-type analyzer for energy and the angular distribution of charged particles," *Rev. Sci. Instrum.* 594(4), pp. 545–549 (1988).

H. Z. Sar-El, "More on the Spherical Condenser An Analyzer I. Nonrelativistic Part," *Nuclear Instruments and Methods* 42, pp. 71–76 (1966).

H. Daimon et al., "New Display-Type Analyzer for the Energy and the Angular Distribution of Charged Particles," *Shimadzu Review*, vol. 47, No. 1, pp. 5–10 (May 1990), Kyoto JP.

Soviet Inventions Illustrated, Section EI, Week 8726, Jul. 8, 1987, Derwent Publications Limited, London, GB and S.U. 1269216 (Electronics Inst) Nov. 7, 1986.

Tremblay et al., "The Truncated Spherical Mirror for Energy Analysis Combined with Direct Measurement of Angular Distribution," *Nuclear Instruments and Methods in Physics Research* 220, pp. 270–287 (1984).

*Primary Examiner*—Bruce C. Anderson
*Attorney, Agent, or Firm*—Leydig, Voit & Mayer

[57] ABSTRACT

A charged particle energy analyzer includes two hemispherical electrodes and means for developing an inverse square electric field in the gap between the two electrodes. An afocal charged particle lens arrangement is arranged to project a charged particle image of a sample into the electric field. Two baffles are disposed in the gap between the electrodes the baffles being effective to restrict the energy and angular divergence of the particles transmitted by the analyzer, the baffles being positioned so as to reduce the dependence of the energy and the orientation of the charged particles transmitted by the baffles on the position of the particles within the image. A two-dimensional detector is arranged to detect the charged particle image transmitted by the analyzer.

14 Claims, 5 Drawing Sheets

CHARGED PARTICLE ENERGY ANALYZERS

BACKGROUND OF THE INVENTION

1. Field of the Invention

This invention relates to charged particle energy analyzers. In particular, the invention relates to charged particle energy analyzers for the analysis of the energy of charged particles, for example electrons, which have been emitted from the surface of a sample by the bombardment of the sample with primary radiation, such as soft X-rays, ultra-violet photons, or electrons.

As the energy of the emitted charged particles will be characteristic of the chemical composition of the part of the sample emitting the charged particles, the energy analysis thus provides information relating to the chemical nature of the surface of the sample.

2. Description of the Prior Art

It is advantageous to be able to obtain information relating to the distribution of particular chemical species over the surface of a sample. A number of charged particle energy analyzers have been developed which perform this imaging function. One such example is described by G. Beamson, H. Q. Porter, and D. W. Turner, in J. Phys. E: Sci. Instrum., 13. pages 64–66, 1980. In the instrument described, the sample is placed in the strongest region of a diverging magnetic field and illuminated with, for example, ultra-violet light or soft X-rays. The resultant photo-electrons spiral about the magnetic flux lines. As the magnetic flux lines diverge, so the mean photo-electron trajectories diverge, such that the photo-electrons can be caused to bombard a two dimensional detector to thereby produce a magnified image of the specimen surface.

In order to perform an energy analysis of the photo-electrons in such an apparatus, if the photo-electrons are still confined within the magnetic field, then an imaging band pass filter may be used, as described by D. W. Turner et al, in Rev. Sci. Instrum. 57(8), 1986. Alternatively, if the photo-electrons are projected into a region of low, or zero, magnetic field, an imaging energy analyzer, as described by R. Castaing and L. Henry in Comptes Rendus (Academy of Science, Paris) 255B, page 76 onwards, 1962, may be utilized. Further magnification of the energy resolved image can then be performed if required, and the final image projected on to a phosphor screen or other suitable device.

In European Patent Application No. 0246841, there is described an electron spectrometer effective to produce an image of a photo-electron emitting surface, energy analysis of the photo-electrons being performed electrostatically. The spectrometer described uses a conventional hemispherical electrostatic deflection analyzer in combination with an electrostatic lens arrangement. The electrostatic lens arrangement performs a transformation of the spatial information in an image of the photo-emitting surface into corresponding angular information, before the photo-electrons enter the space between the two hemispheres constituting the analyzer, on an equatorial plane of the hemispheres. The transformation is achieved by arranging for an electron lens to be positioned between a magnified image of the photo-emitting surface and the analyzer, with the magnified image at one focal plane of the lens, and the entrance plane of the analyzer at the other focal plane of the lens. Thus there is a direct relationship between the angle that the photo-electron trajectory makes with the electron-optical axis of the analyzer at the entrance to the hemispheres, and the photo-electron's position within the magnified image. An image which is spatially dispersed in energy is produced at the exit plane of the analyzer, the image preserving the angular information within the input image. An aperture at the exit plane can then be used to select a narrow band of energies from the beam of photo-electrons. A further electron lens is positioned such that the exit of the analyzer is at the object side focal plane of the lens. This lens will thus reconstruct the magnified image of the sample surface at the image side focal plane of the lens, which reconstructed image may be viewed directly on a phosphor screen, or other suitable device. It will be appreciated that such an apparatus necessitates the conversion between spatial and angular information, thus requiring careful alignment of the electrostatic lens arrangement.

H. Z. Sar-El in an article in Nuclear Instruments and Methods 42, pages 71–76, 1966 describes a charged particle energy analyzer including an electrostatic spherical mirror analyzer in which a baffle is incorporated between the spheres, the baffle being effective to improve the resolution of the analyzer. This analyzer is, however, only capable of imaging a point or small source.

H. Diamon, in an article in Rev. Sci. Instrum. 59(4), 1988, describes an instrument in which an aperture is placed at the image point on the equatorial plane of a pair of hemispheres constituting a hemispherical mirror electrostatic analyzer. Photo-electrons, from a point source located on the equatorial plane of the hemispheres, enter and leave the field between the hemispheres via gridded portions of the inner hemisphere. This enables a very large angular range, up to 2 steradians of photo-electrons emitted by a sample, to be analyzed simultaneously. Photo-electrons with an energy different to the pass energy of the analyzer are focused to a point before, or after, the aperture, and so are less likely to be transmitted through the aperture. Such an apparatus, however, does not perform simultaneous energy analysis of a large number of points contained within a two-dimensional surface.

U.K. Patent Application GB-2221082A describes a charged particle energy analyzer including an electrostatic spherical mirror analyzer that may be used for forming an image of secondary electrons emitted from a surface. The analyzer described does not, however, have the property that the energies of the electrons forming the image are independent of their position in the image. Thus, the analyzer is not able to achieve the high energy resolution necessary to unambiguously determine the distribution and chemical state of elements on a surface.

SUMMARY OF THE INVENTION

It is an object of the present invention to provide an alternative charged particle energy analyzer to those described above, the analyzer having the possibility of providing spatial information relating to chemical composition over the surface of a sample.

It is a further object of the present invention to provide an alternative charged particle energy analyzer to those described above, the analyzer being capable of more efficient collection of charged particles from a sample than is necessarily the case in the known analyzers.

According to the present invention, a charged particle energy analyzer comprises means for producing a substantially inverse square electric field in the gap between two electrodes such that the analyzer acts as a spherical mirror analyzer, means for producing a charged particle image of a sample on to the object plane of the analyzer, the object plane being located in a substantially field free region closer to the center of curvature of the equipotentials of the inverse square electric field than the gap between the two electrodes, a baffle means disposed in the gap between the two electrodes, such that the baffle means restricts the energies of the charged particles transmitted by the analyzer, at least part of the baffle means being positioned so as to reduce the dependence of the energies of the charged particles transmitted by the baffle means on the position of the charged particles within the image, and a detector means effective to detect charged particles at least partially transmitted through the analyzer.

The detector means may comprise a two dimensional detector located at the image Plane of the analyzer, for providing an indication of the position in the image of charged particles transmitted by the analyzer.

Preferably the baffle means is effective to limit the range of orientations of the particles transmitted by the analyzer, part of the baffle means being positioned so as to reduce the dependence of the orientations of the charged particles transmitted by the baffle means on the position of the particles within the image.

Preferably, the baffle means is constructed so as to minimize the perturbation of the radial electrical field by the baffle means. This is suitably achieved by constructing each baffle within the baffle means of a plurality of electrically isolated segments, the analyzer including means for electrically biassing the segments so as to minimize the perturbation. Where each baffle is constructed of a number of segments, preferably the analyzer includes means for moving the segments relative to one another so as to vary the apparent opening in the baffle.

Where the baffle means comprises a number of segments, alternatively or additionally the detector means may comprise a plurality of charged particle detectors, each contained within a respective segment so as to enable several energy intervals to be detected simultaneously.

The analyzer suitably contains a third electrode, and means for producing an electric field between the third electrode and one of the two electrodes, to enable the energy analysis of charged particles from the sample passing between the third electrode and said one electrode by the detector means.

The means for projecting the emitted charged particles suitably comprises an afocal charged particle lens system effective to project a magnified image of the sample onto the object plane of the analyzer.

BRIEF DESCRIPTION OF THE DRAWINGS

One embodiment of a charged particle energy analyzer, in accordance with the invention, will now be described, by way of example only, with reference to the accompanying figures in which.

DESCRIPTION OF THE PREFERRED EMBODIMENT

Figure 1:
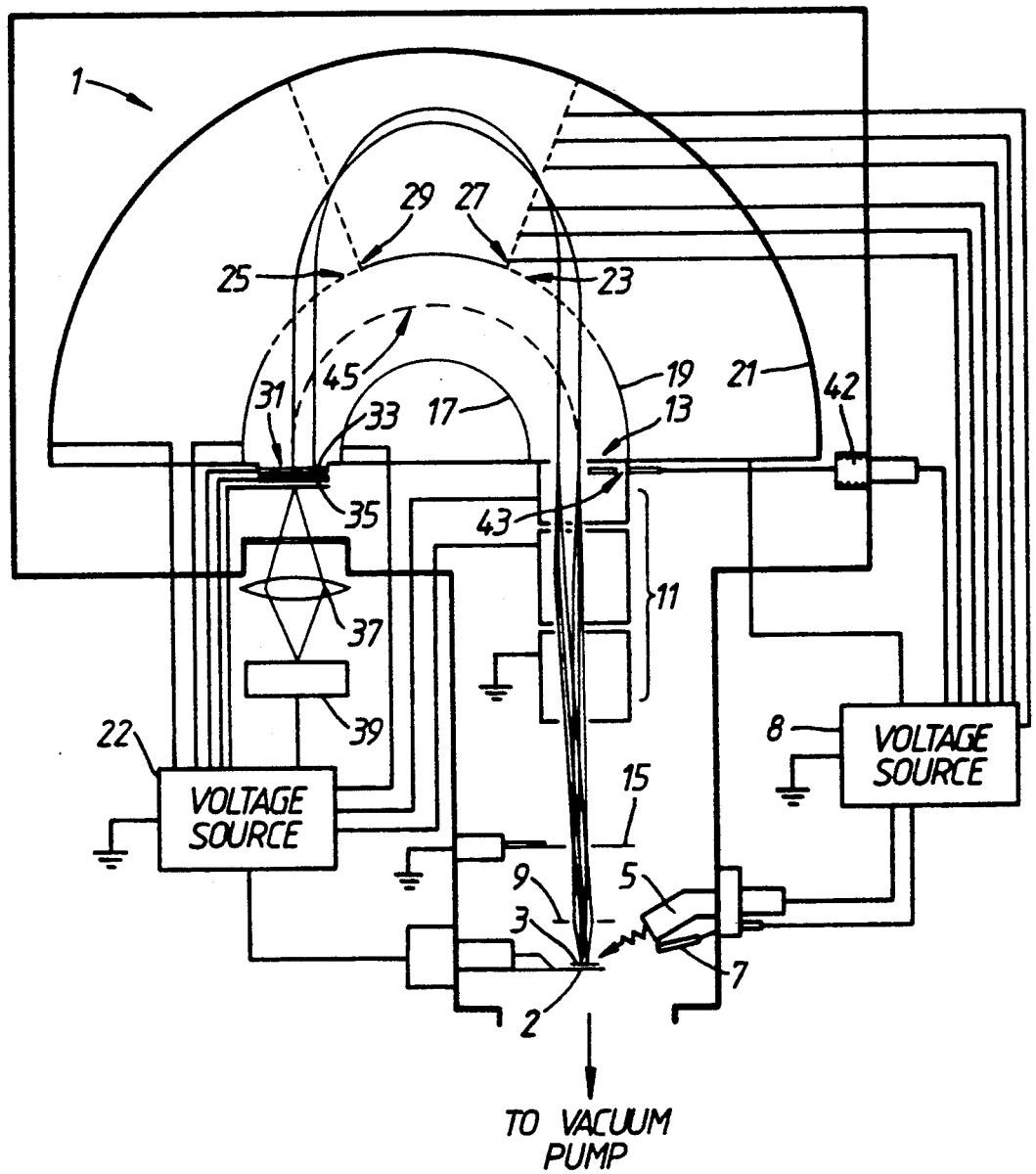
FIG. 1 is a schematic cross-section of a photo-electron spectrometer system incorporating the embodiment of the charged particle energy analyzer in accordance with the invention.

Referring firstly to FIG. 1, the apparatus to be described is a photo-electron spectrometer with an imaging capability, the spectrometer having a hemispherical, electrostatic analyzer 1 which will be described in more detail hereafter. The spectrometer includes a sample holder 2 on which a sample 3 may be mounted. Two alternative irradiation sources are provided, that is an X-ray source 5 and an electron source 7, each source being capable of causing photo-electrons or secondary electrons to be emitted from the sample 3. The sources 5,7 are powered by a high voltage source 8, together with suitable control means.

First and second electron lens systems 9,11 are arranged to focus photo-electrons emitted from the sample 3 on to the object plane 13 of the analyzer 1. An aperture 15 is placed at the back focal plane of the lens 9, the aperture being effective to control the angular range of the photo-electrons emitted from the sample, and also to allow the effects of lens aberration on the spatial resolution of the spectrometer to be controlled. The lenses 9,11 are arranged to be afocal, that is, a photo-electron emitted from the sample surface parallel to the lens axis will leave the lens system 11 and enter the analyzer 1 parallel to that axis. This ensures that the energy analyzed by the analyzer 1 is constant across the image, and is achieved by making the focal planes of the lens systems 9 and 11, coincident at the position of the aperture 15. The lens systems 9,11 thus project a magnified image of the surface of the sample 3 on to the analyzer object plane 13, the photo-electron beam energy being retarded if necessary, either by the lens system 11, or at the entrance to the analyzer 1.

The analyzer 1 comprises three concentric hemispherical electrodes 17,19,21, the radius 2a of the outer hemisphere 21 being twice that of the central hemisphere 19. A voltage source 22 is arranged to apply suitable potentials to the hemispheres 17,19,21 dependent on the required mode of operation of the spectrometer. The central hemisphere 19 is provided with two gridded regions 23,25, whose function will be described hereafter. Between these regions 23,25, in the gap between the central 19 and outermost hemispheres 21, there are provided two baffles 27,29.

At the output image plane 31 of the analyzer 1 there is provided a detector system including a pair of micro-channel plates 33, and adjacent to the micro-channel plates 33 a phosphor screen 35. A lens system 37 is effective to focus light from the phosphor screen 35 onto a detector array 39 which allows recording and further analysis of the image produced on the plate. A suitable vacuum pumping system (not shown) of conventional design, typically incorporating an ion pump, backed by turbo-molecular pumps is arranged to maintain the pressure in the region incorporating the sample 3 at typically $10^{-9}$ Torr, and the pressure in the analyzer 1 at typically $10^{-10}$ Torr.

Where the apparatus is to be used to produce an image of the spatial distribution of photo-electrons of a chosen energy in the sample 3, that is indicative of the location of a particular chemical species in the sample, the voltage source 22 is used to develop an electric field between the central and outer hemispheres 19,21, the inner hemisphere 17 being held at the same potential as the central hemisphere. Thus the outer hemisphere 21 is held at a potential of $-V$ with respect to the middle hemisphere 19, where V is a voltage equal to the energy in electron volts after retardation of the photo-electron energy of interest from the sample 3. Other radii for the outer hemisphere 21 may be used provided the potential applied is adjusted so as to generate the same electric field as is generated by a hemisphere of radius $2a$ and potential $-V$. Photo-electrons from the sample 3 are focused by the lens systems 9,11 on to the object plane 13 of the analyzer 1 through the field free region between the hemispheres 17,19, entering the radial field through the gridded section 23 of the central hemisphere 19. The photo-electrons are then deflected, focused and dispersed in energy by the electric field between the hemispheres 19,21. The photo-electrons will pass through the opening in the baffle 27 provided that their trajectory lies within a certain angular range relative to the axis of the lens system 11. If the photo-electrons have the correct energy range they will also pass through the opening in baffle 29 and then through the second gridded section 25 of the middle hemisphere 19. The photo-electrons then pass through the field free region between the hemispheres 19,17, until they reach the image plane 31 of the analyzer, the image plane lying on the equatorial plane of the hemispheres 17,19,21. At the image plane 31, the two-dimensional micro-channel plate 33 amplifies the electron current in the image while retaining the spatial integrity of the image. The amplified image is then projected onto the phosphor screen 35, and subsequently through the viewing system 37,39 for recording, and possible further analysis.

It will be appreciated that by stepping the voltages across the electrodes 19,21 by means of the voltage source 22, an energy spectrum from several selected regions of the specimen 3 may be built up simultaneously.

In order to operate the system as a conventional electron spectrometer, a manipulator 42 is arranged to insert an entrance slit, or aperture, 43 into the photo-electron path at the entrance to the hemispherical analyzers. The voltage source 22 is used to step the voltages applied to the inner and central hemispheres 17,19 in conventional manner, such that these hemispheres act as a conventional hemispherical electrostatic deflection analyzer to successively allow the transmission of photo-electrons of different energies along the dotted path 45 indicated, through the gap between the hemispheres 17,19 onto the micro-channel plate 33. Thus, the plate 33 at any one time will register a two-dimensional image of energy radially against spatial information along the axis defined by the position of the slit 43.

Figure 2:
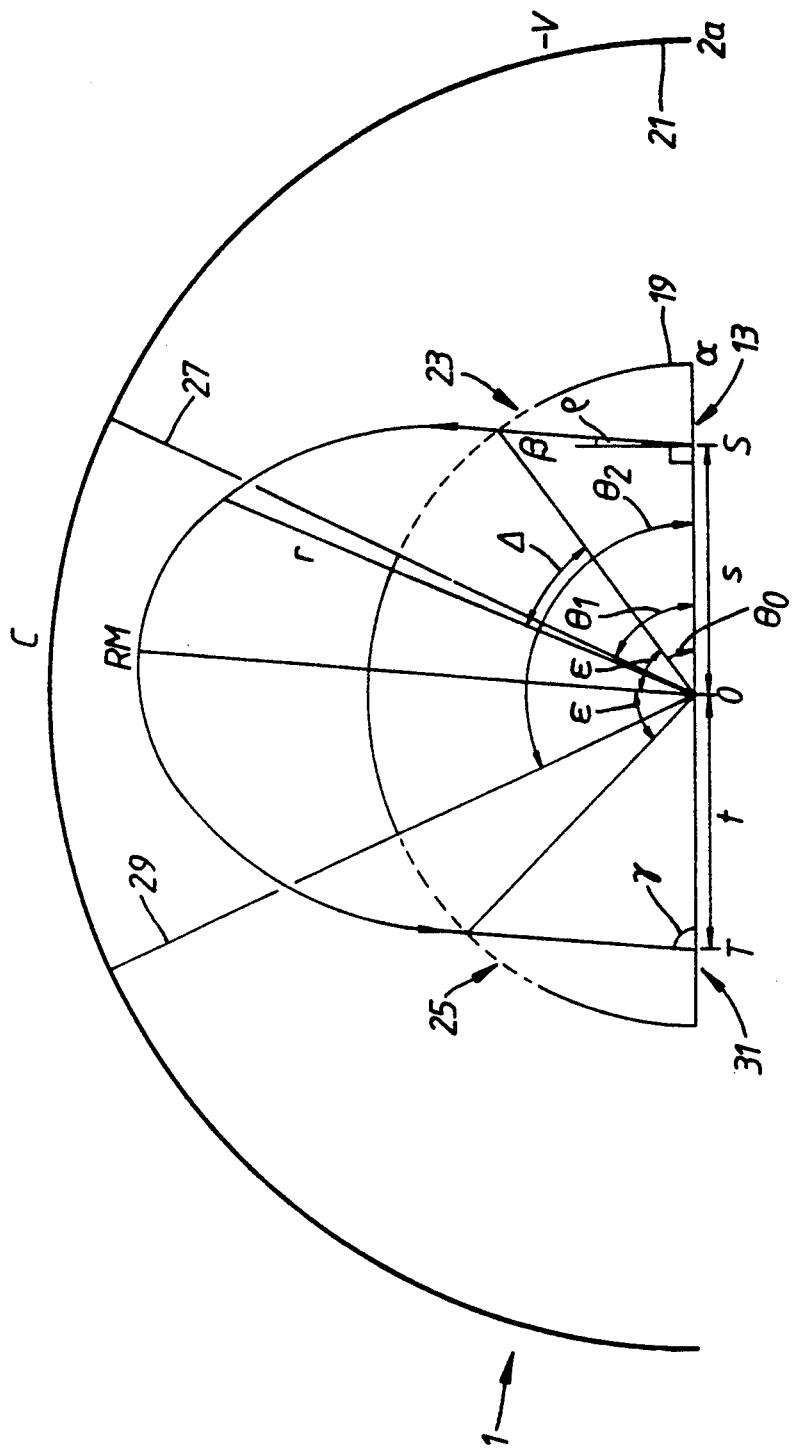
FIG. 2 is an enlarged view of part of the analyzer of FIG. 1, illustrating the parameters defining the photo-electron trajectories through the analyzer.

The imaging function of the analyzer 1 will now be described in more detail, with reference to FIG. 2 in which S represents the position s at the object plane 13 of a photo-electron emitted from the center of the sample 3, and T is the corresponding position t of the photo-electron detected by the micro-channel plate 33 at the image plane 31 of the analyzer 1. The radial position (r, $\theta$) of the photo-electron may be expressed in terms of the variables, $s,t,\theta_o,\theta_1,\theta_2,\rho,\Delta$ defined in FIG. 2 as follows:

$$r = a\eta \sin^2 \beta / [1 - \cos\Delta - \eta \sin\beta \sin(\Delta - \beta)] \quad (1)$$

where
$\beta = \pi/2 - \rho - \theta_o = \sin^{-1}(s/a \cos \rho)$
$\Delta = \theta - \theta_o$
$\eta = E_k/E_o$
$E_k$ = the kinetic energy of the photo-electron of interest
$E_o = eV$ = the kinetic energy of a photo-electron at the pass energy of the analyzer It will be seen that the maximum value of $r, r_{max}$ corresponds to the length O-RM in FIG. 2, and is given by:

$$r_{max} = a\eta \sin^2 \beta / [1 - \cos\epsilon - \eta \sin\beta \sin(\epsilon - \beta)] \quad (2)$$

where
$\epsilon = \tan^{-1}[\sin \beta / ((1-\eta)/(\eta \cos \beta) + \cos\beta)]$ where
$\gamma = \pi/2 - \rho + 2\epsilon - 2\beta$ and
$t = a \cos \rho / \sin\gamma$ If the kinetic energy, $E_k$ of the photo-electron is equal to the pass energy of the analyzer 1, then $\eta = 1$ and $\epsilon = \beta$. Thus t will be equal to s, and all electrons from S will converge to T independently of their initial angular divergence $\rho$. The focusing of the analyzer will then be perfect in the plane defined by S, T and RM. For photo-electrons passing through the analyzer 1 out of this plane it may be seen, on the grounds of symmetry, that the focusing will also be perfect. As the concentric hemispheres 19,21 are cylindrically symmetrical about the axis S-T, any ray leaving S out of the plane defined by S,T and C, will follow the same path in a radial direction as it would have done if it had been travelling in the S-T-RM plane. Similarly, since the line O-C is also an axis of symmetry of the hemispheres 19,21, photo-electron trajectories from points in the object plane constituting two-dimensional surface centered around S will be focused to corresponding points around T in the image.

The angles $\theta_1$, $\theta_2$ defining the positions of the baffle planes 27,29 are chosen to satisfy the condition that the distance r of the photo-electron path from the center of curvature O of the hemispheres 17,19,21, is indpendent to the first order on the starting position s. By taking the angular divergence $\rho$ of the beam to be zero, and considering photo-electrons travelling at the pass energy $E_o$, it is possible to show that there are only two values of $\theta$ for which the partial derivative $\partial r/\partial s$ equals zero. These are $$\theta_1 = \sin^{-1}\left(\frac{2\sin\phi}{1 + \sin^2\phi}\right) \quad (3)$$

and $$\theta_2 = \pi - \sin^{-1}\left(\frac{2\sin\phi}{1 + \sin^2\phi}\right) \quad (4)$$

where $\phi$ is equal to $\theta_o$ for the center of the image 13 and for $\rho=0$ By taking the partial derivatives $\partial r/\partial \eta$ at these values of $\theta_1$ and $\theta_2$, it is possible to show that there is a spatial dispersion in energy at the planes defined by $\theta_1$ and $\theta_2$, but to a first order no dependence of r on s, i.e. at $$\theta_1 \frac{\partial r}{\partial \eta}\bigg|_{\eta=1,\rho=0} = a(1-\cos\phi)(2-\cos^2\phi)$$

and at $$\theta_2 \frac{\partial r}{\partial \eta}\bigg|_{\eta=1,\rho=0} = a(1-\cos\phi)(2-\cos^2\phi)$$

It will be noticed that the value of $\partial r/\partial \eta$, that is the spatial dispersion of energy, is much larger at $\theta_2$ than at $\theta_1$. This indicates that by positioning the baffle 29 at the position defined by $\theta_2$ with a small opening width w, at a radius r given by substituting the value of $\theta_2$ defined by equation (4) into equation (1), a narrow band of energies of photo-electrons may be selected from a range of values of s. Thus only photo-electrons within a certain energy range will be transmitted from the object plane 13 to form the image at the image plane 31. It will be appreciated, however, that the baffle 27 at the position defined by $\theta_1$ will also restrict the range of photo-electron energies transmitted by the analyzer.

Figure 3:
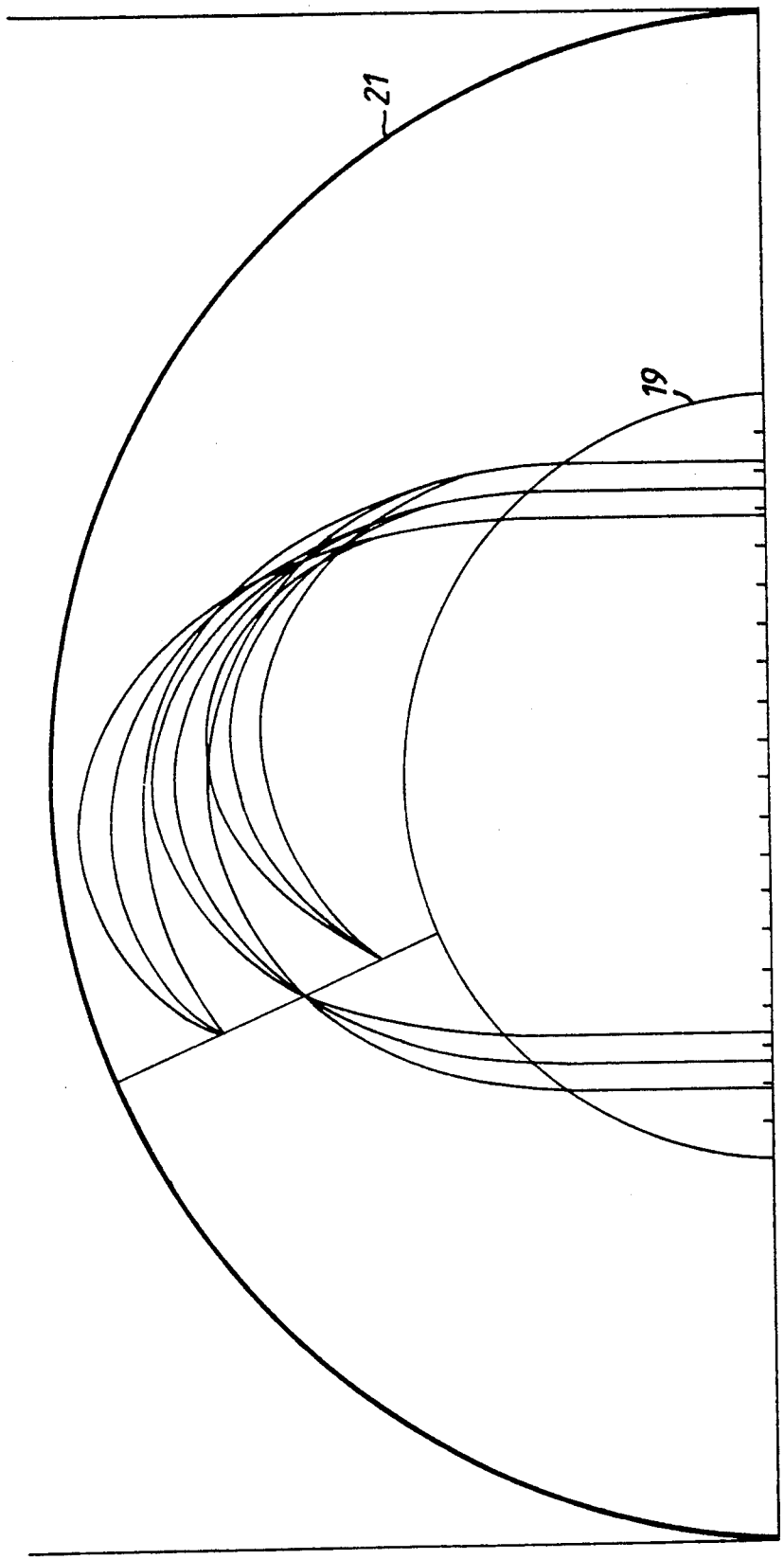
FIG. 3 illustrates the energy dispersing properties of the analyzer.

It can be shown that the relative energy resolution $\Delta E/E_o$ of the analyzer due to the presence of the baffle 29 at position defined by $\theta_2$, is given by $$E/E_0 = \frac{w}{a} \frac{1}{(1+\cos\phi)(2-\cos^2\phi)} + 2\rho\tan\phi/2 \qquad (5)$$

where $\Delta E$ is the full width of the energy distribution transmitted through an aperture of width w in the baffle 29. FIG. 3 shows the trajectory plots for an input half angle $\rho$ of 0.015 radians, a value of s/a of 0.75 for the center of the object plane 13, and electron energies of 0.9, 1.0 and 1.1 times the pass energy of the analyzer. The apparent opening widths w of the baffles 27,29 may be varied by mechanical adjustment. As can be seen from FIGS. 1 and 2, the photo-electron beam does not pass through the baffles 27,29 normal to the plane of the baffles 27,29. By creating the baffles in two halves, each half being planar, part annular and centered on O, if each half is separately rotated about an axis through O perpendicular to the plane STC, then the apparent opening width w as viewed along the direction of the photo-electron beam may be altered. The value of $\rho$ may be controlled via the lens system 11, for example, by the inclusion of an adjustable iris at the back focal plane of one of the lenses.

In the particular embodiment described, however, the baffle 27 positioned at the plane defined by $\theta_1$ is used to restrict the half angular range $\rho$ of the photo-electron beam. At the plane defined by $\theta_1$ $$\frac{\partial r}{\partial \rho}\bigg|_{\eta=1,\rho=0} = a\sin\phi(1+\sin^2\phi)$$

Thus, to a first approximation, the required width $\Delta r$ of the opening in the baffle 27 needed to restrict the angular range in the photo-electron beam is $$\Delta r = 2\rho_{max} \, a \, \sin\phi(1+\sin^2\phi) \qquad (6)$$

The baffles 27,29 may be formed of a number of segments electrically isolated from each other, so that they can be biased to minimize their perturbation on the radial electric field developed between the hemispheres 19,21. It will be appreciated that while it is convenient for the object and image planes 13,31 of the analyzer 1 to be located on the equatorial plane of the hemispheres 17,19,21, these planes may be displaced along the electron optical axis of the analyzer 1 without altering the positions of the baffles 27,29 defined by equations (3) and (4).

Referring to FIG. 2, if the object plane 13, which is considered to lie on the diameter of the hemisphere passing through S, and perpendicular to the plane of the Figure, is displaced along the direction defined by $\rho=0$, then the image plane 31 will also be displaced an equal amount such that the conjugate points in the image T are diametrically opposite the corresponding points in the object. Thus if S moves toward grid 23 along the direction of the beam, then T will move away from grid 25. The orientations of the baffle planes defined by $\theta_1$ and $\theta_2$ will remain same, since they are determined by the value of s.

It will be appreciated that, although the baffles may be approximated by planar part annuli centered on O, this is a compromise between the symmetry requirements for focussing of electrons whose trajectories leave S out of the plane defined by STC (in which case the baffle should be shaped as part of a cone with axis OS, vertex in O and half angle $(\pi-\theta_2)$) and that required for focusing points in a two dimensional surface centered around S normal to OC (in which case the baffle should be shaped as part of a cone with axis OC, vertex in O and half angle $(\theta_2-\pi/2)$).

Figure 4:
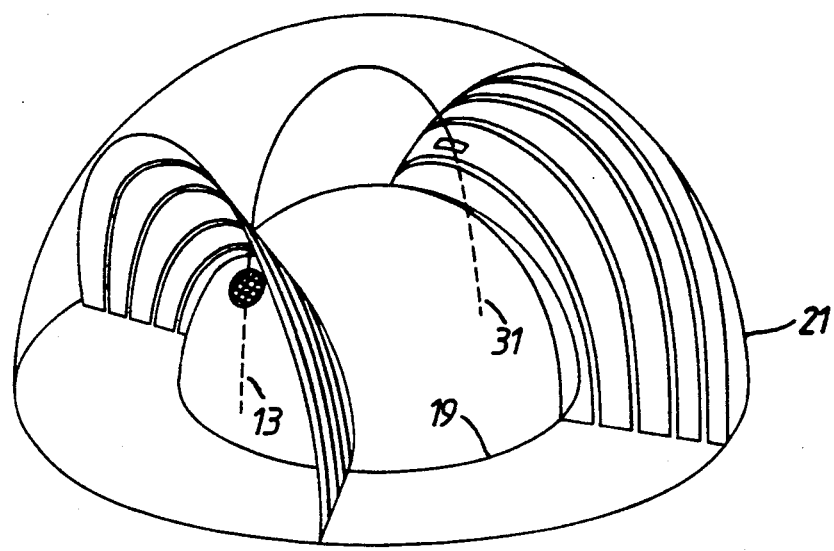
FIG. 4 is a schematic perspective view of a baffle arrangement for incoproration in the analyzer of FIG. 1.

FIG. 4 illustrates a possible conical baffle arrangement appropriate for electrons whose trajectories leave the object plane 13 at angles out of the plane STC.

Figure 5:
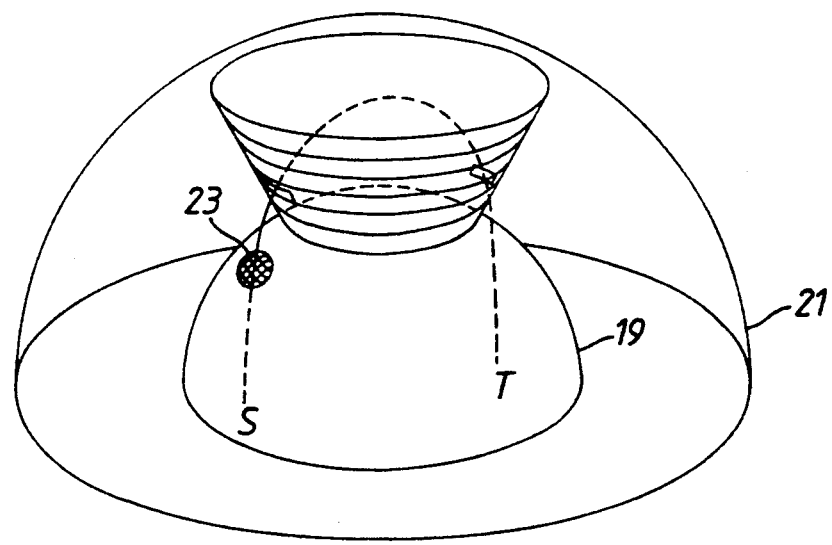
FIG. 5 is a schematic perspective view of an alternative baffle arrangement for incorporation in the analyzer of FIG. 1.

FIG. 5 illustrates an alternative conical baffle arrangement appropriate for electrons originating from positions in the object plane 13 not lying on the line S-T.

Figure 6:
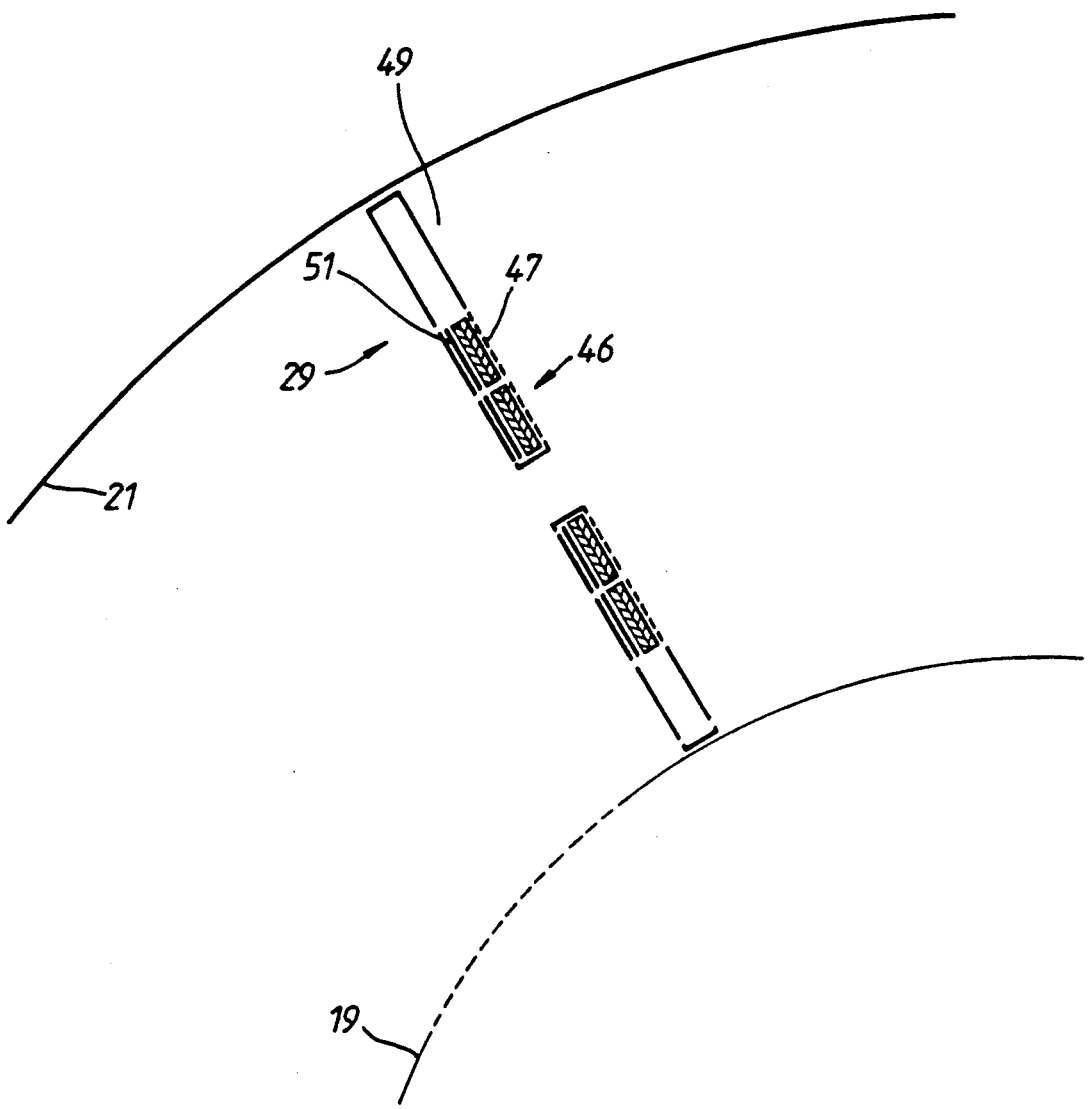
FIG. 6 is a schematic illustration of an electron detector which may be incorporated in the analyzer of FIG. 1.

Referring now to FIG. 6, the baffle 29 may additionally contain a number of electron detectors 46, one detector being embedded in each segment of the baffle. In the particular detector configuration illustrated in FIG. 4, each detector 46 comprises a grid 47 forming part of the wall of the baffle 29, a microchannel plate 49, and an anode collector 51, electrons passing through the grid 47, to be directed and amplified by the microchannel plate 49 onto the collector 51. The collector 51 is connected to appropriate electronics (not shown). The radial position of an electron at this baffle 29 will be substantially independent of the value of s, that is the start position of the electron at the object plane 13, and hence via the lens system 9,11 on the sample 3, but will be dependent on the angle $\rho$ and the energy $\eta$. Each detector 46 will thus register a different narrow range of energies, FIG. 3 illustrating the paths of electrons of 3 different energies originating from 3 different starting positions on the sample 3. As the analyzed energy of photo-electrons is varied, a spectrum may be built up in the conventional manner. The signals offset from the pass energy is corrected, before the signals are added by the data acquisition system to form the spectrum. The photoelectron signal characteristic of a particular element at each detector will be substantially independent of the spatial distribution of the element on the surface. Such an arrangement makes more efficient use of the photoelectrons emitted from the sample 3.

It will be appreciated that while the incorporation of the plate 33 enables a two-dimensional image of the energy distribution of particles over the sample 3 to be produced, where the baffle 29 contains the detectors 45, the plate 33 may be omitted to produce an analyzer without an imaging capability.

It will be appreciated that the gridded regions 23 of the central hemisphere 19 may be replaced by holes in the central hemisphere, positioned so as to enable electrons from the sample 3 to enter the radial field region between the central hemisphere 19 and the outer hemisphere 21.

It will also be appreciated that while it is particularly convenient to include the innermost hemisphere 17 so as to enable the possibility of conventional energy analysis of photo-electrons from the sample 3, this may readily be omitted.

It will also be appreciated that the sample 3 may be placed directly at the object plane 13 of the analyzer, the lens system 9,11 being omitted, and the irradiation sources 5,7 being repositioned accordingly so as to produce photoelectrons from the sample 3 at the object plane 13.

It will also be appreciated that, while the particular embodiment described herebefore, by way of example, is an analyzer incorporated in a photo-electron spectrometer, the invention is also applicable to energy analyzers for measuring the energy of positive or negative ions.

What I claim is:

1. A charged particle energy analyzer comprising two electrodes, said two electrodes defining a gap therebetween, means for producing a substantially inverse square electric field in said gap between said two electrodes such that the analyzer acts as a spherical mirror analyzer, an object plane of the analyser located in a substantially field free region closer to the center of curvature of the equipotentials of the inverse square electric field than said gap between the two electrodes, and means for producing a charged particle image of a sample on to said object plane, wherein the analyzer includes a baffle means disposed in said gap between the electrodes, such that the baffle means restricts the energies of the charged particles transmitted by the analyzer, at least part of the baffle means being positioned so as to reduce the dependence of the energies of the charged particles transmitted by the baffle means on the position of the particles within the image, and a detector means effective to detect charged particles at least partially transmitted through the analyser.

2. A charged particle energy analyzer according to claim 1 in which the detector means comprises a two dimensional detector, located at the image plane of the analyzer, for providing an indication of the position in the image of charged particles transmitted by the analyzer.

3. A charged particle energy analyzer according to claim 1, in which the baffle means is effective to limit the range of orientations of the particles transmitted by the analyzer, part of the baffle means being positioned so as to reduce the dependence of the orientations of the charged particles transmitted by the baffle means on the position of the particles within the image.

4. A charged particle energy analyser according to claim 3, in which the baffle means comprises a number of individual baffles, each baffle being constructed of a plurality of electrically isolated segments, the analyzer including means for electrically biassing the segments so as to minimize said perturbation.

5. A charged particle energy analyzer according to claim 4 in which the detector means comprises a plurality of charged particle detectors each contained within a respective segment so as to enable several energy intervals to be detected simultaneously.

6. A charged particle energy analyzer according to claim 1, in which the baffle means is constructed so as to minimize the perturbation of the inverse square electric field by the baffle means.

7. A charged particle energy analyzer according to claim 1, in which the baffle means comprises a number of individual baffles, each baffle being constructed of a plurality of segments, the analyzer including means for moving the segments relative to one another, so as to vary the apparent opening in the baffle.

8. A charged particle energy analyzer according to claim 1 in which the baffle means has a planar surface.

9. A charged particle energy analyzer according to claim 1 in which the baffle means has a part conical surface.

10. A charged particle energy analyzer according to claim 1 including a third electrode, and means for producing an electric field between the third electrode and one of the two electrodes, to enable the energy analysis of charged particles from the sample passing between the third electrode and said one electrode by the detector means.

11. A charged particle energy analyzer according to claim 1 in which each of the electrodes is at least partially spherical.

12. A charged particle energy analyzer according to claim 1, in which the means for producing the charged particle image comprises an afocal charged particle lens system effective to project a magnified image of the sample onto the object plane of the analyser.

13. A charged particle energy analyzer according to claim 1, in which the electrode closest to the sample of the two electrodes has perforated regions so as to enable the entrance and exit of the charged particles into and from the gap between the two electrodes.

14. A charged particle energy analyzer according to claim 1, in which the detector means includes a microchannel plate.

* * * * *